(12) United States Patent
Mantani

(10) Patent No.: US 9,895,874 B2
(45) Date of Patent: Feb. 20, 2018

(54) SCREEN PRINTING APPARATUS AND SCREEN PRINTING METHOD

(71) Applicant: Panasonic Intellectual Property Management Co., Ltd., Osaka (JP)

(72) Inventor: Masayuki Mantani, Saga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/486,696

(22) Filed: Apr. 13, 2017

(65) Prior Publication Data
US 2017/0313053 A1    Nov. 2, 2017

(30) Foreign Application Priority Data

Apr. 27, 2016 (JP) .................................. 2016-089330
Apr. 27, 2016 (JP) .................................. 2016-089331

(51) Int. Cl.
*B41F 15/08* (2006.01)
*B41M 1/12* (2006.01)
*B41F 15/34* (2006.01)

(52) U.S. Cl.
CPC .............. *B41F 15/34* (2013.01); *B41F 15/08* (2013.01); *B41M 1/12* (2013.01)

(58) Field of Classification Search
CPC .. B41F 15/08; B41F 15/0813; B41F 15/0881; B41F 15/14; B41F 15/16; B41F 15/18; B41F 15/26; B41F 15/34; B41F 15/36; B41M 1/12; B41P 2215/11; H05K 3/1233; H05K 3/1216; H05K 3/1225
USPC .................................................. 101/126, 129
See application file for complete search history.

(56) References Cited

U.S. PATENT DOCUMENTS

2003/0041753 A1\* 3/2003 Regner ............... B41F 15/0813
                                                          101/129
2006/0048383 A1    3/2006 Nishiwaki et al.

FOREIGN PATENT DOCUMENTS

JP          4619896 B2      1/2011

\* cited by examiner

*Primary Examiner* — Leslie J Evanisko
(74) *Attorney, Agent, or Firm* — Pearne & Gordon LLP

(57) ABSTRACT

A screen printing apparatus for printing paste on a printed pattern of a print target constituted of a substrate or a plurality of aligned substrates includes a mask having a plurality of opening patterns different in size from one another. The screen printing apparatus images the substrate or one of the aligned substrates constituting the print target, and calculates a level of deformation by expansion and contraction of the print target, based on a result of the imaging. The screen printing apparatus then selects an opening pattern from among the opening patterns, based on the calculated level of deformation by expansion and contraction of the print target, brings the print target into contact with the mask to superimpose the selected opening pattern on the printed pattern, and deposits the paste on the printed pattern.

5 Claims, 9 Drawing Sheets

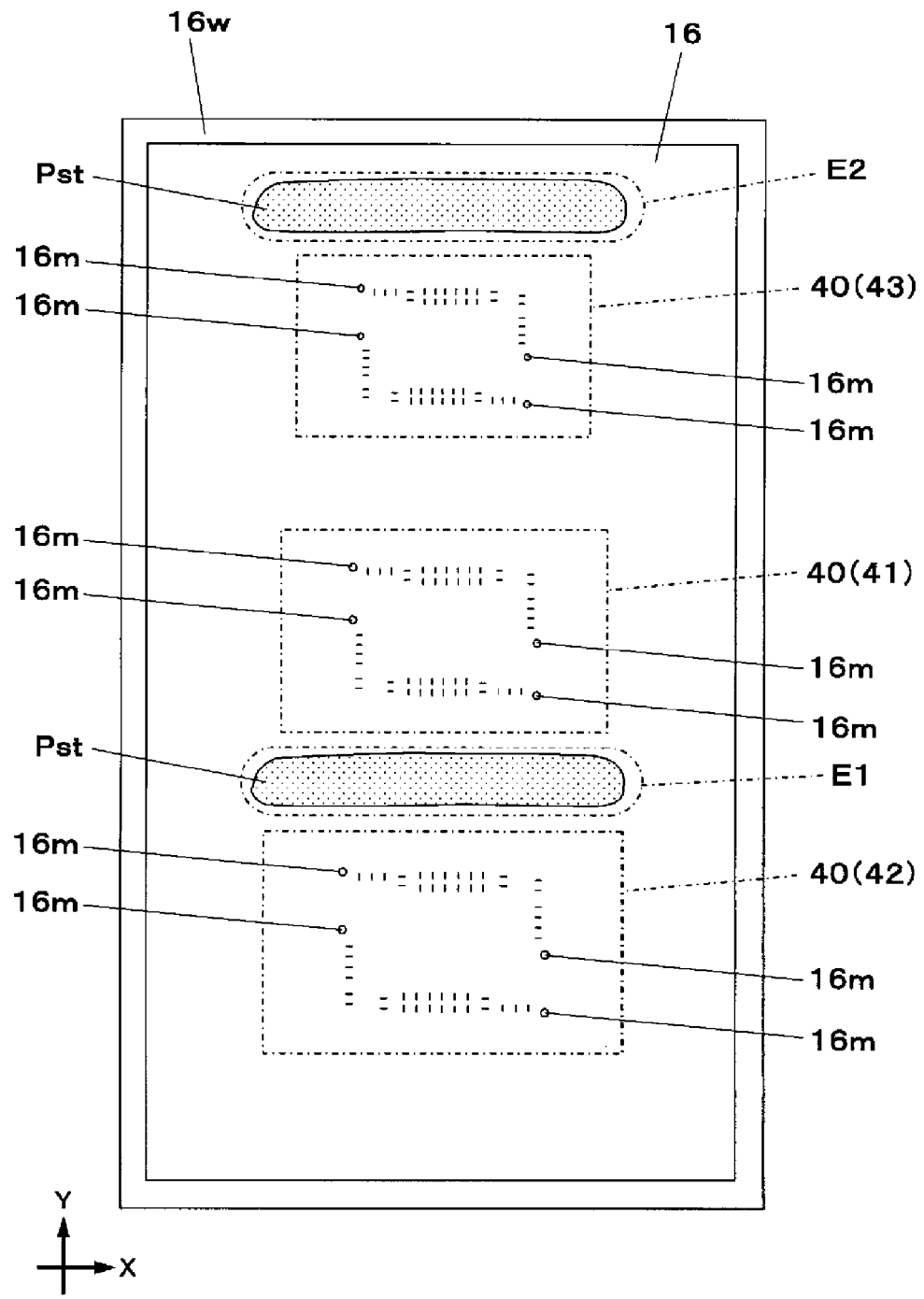

SCREEN PRINTING APPARATUS AND SCREEN PRINTING METHOD

BACKGROUND

1. Technical Field

The present disclosure relates to a screen printing apparatus and a screen printing method.

2. Description of the Related Art

Conventionally, screen printing apparatuses have been frequently used for printing paste such as solder on a printed pattern of a print target constituted of a substrate or a plurality of aligned substrates. The printed pattern refers to a combination of electrode patterns on individual substrates. In printing paste on a printed pattern of a print target using a screen printing apparatus, a mask is prepared in advance, which has an opening pattern corresponding to the printed pattern. The print target is conveyed below the mask, is brought into contact with a lower surface of the mask with the paste squeezed into the opening pattern, and is separated (released) from the mask. The paste is thus deposited on the printed pattern in correspondence with the opening pattern.

Such a screen printing apparatus has been required to accurately bring the print target into contact with the mask to vertically superimpose the opening pattern on the printed pattern. To meet this requirement, a mask is provided with marks (mask-side marks) and a substrate constituting a print target is also provided with marks (substrate-side marks). The print target is brought into contact with the mask with the substrate-side marks aligned with the mask-side marks. If the print target undergoes in-plane deformation by expansion and contraction since the substrate constituting the print target is a film-shaped substrate, the opening pattern is not completely superimposed on the printed pattern. However, as a whole (in an average meaning), the opening pattern is superimposed on the printed pattern with accuracy within an allowable range where a deviation between the printed pattern and the opening pattern is permitted. Patent Literature 1 discloses a technique for individually imaging at least three marks on a substrate, thereby accurately recognizing a deviation between a printed pattern and an opening pattern.

CITATION LIST

Patent Literature

PTL 1: Unexamined Japanese Patent Publication No. 2006-86515

SUMMARY

However, when the level of deformation by expansion and contraction of the print target is large, the conventional screen printing apparatus described above can accurately recognize the deviation between the printed pattern and the opening pattern, but fails to superimpose the opening pattern on the printed pattern with the accuracy within the allowable range. Therefore, a printing failure of the paste onto the print target occurs sometimes.

It is therefore an object of the present disclosure to provide a screen printing apparatus and a screen printing method by which a printing failure is less likely to occur even when the level of deformation by expansion and contraction of a print target is large.

The present disclosure provides a screen printing apparatus for printing paste on a printed pattern of a print target constituted of one substrate or a plurality of aligned substrates. The screen printing apparatus includes a mask, a conveyance unit, an imaging unit, a deformation level calculation unit, a selecting unit, and a contact mechanism. The mask has a plurality of opening patterns different in size from one another. The conveyance unit conveys the print target below the mask. The imaging unit images the substrate or one of the aligned substrates constituting the print target. The deformation level calculation unit calculates a level of deformation by expansion and contraction of the print target, based on a result of the imaging by the imaging unit. The selecting unit selects one of the opening patterns, based on the level of deformation by expansion and contraction of the print target, the level being calculated by the deformation level calculation unit. The contact mechanism brings the print target conveyed below the mask by the conveyance unit, into contact with the mask. The contact mechanism moves the mask and the print target relatively to superimpose the opening pattern selected by the selecting unit on the printed pattern.

The present disclosure also provides a screen printing method for printing paste on a printed pattern of a print target constituted of one substrate or a plurality of aligned substrates. The screen printing method includes a conveyance step, an imaging step, a deformation level calculation step, a selecting step, and a contact step. The conveyance step includes conveying the print target below a mask having a plurality of opening patterns different in size from one another. The imaging step includes imaging the substrate or one of the aligned substrates constituting the print target. The deformation level calculation step includes calculating a level of deformation by expansion and contraction of the print target, based on a result of the imaging in the imaging step. The selecting step includes selecting an opening pattern from among the opening patterns, based on the level of deformation by expansion and contraction of the print target, the level being calculated in the deformation level calculation step. The contact step includes bringing the print target conveyed below the mask in the conveyance step, into contact with the mask. The contact step also includes moving the mask and the print target relatively to super impose the opening pattern selected in the selecting step on the printed pattern.

According to the present disclosure, a printing failure is less likely to occur even when the level of deformation by expansion and contraction of a print target is large.

BRIEF DESCRIPTION OF THE DRAWINGS

FIG. 5 is a plan view of a mask for the screen printing apparatus according to the exemplary embodiment of the present disclosure;

DETAILED DESCRIPTION

Figure 1:
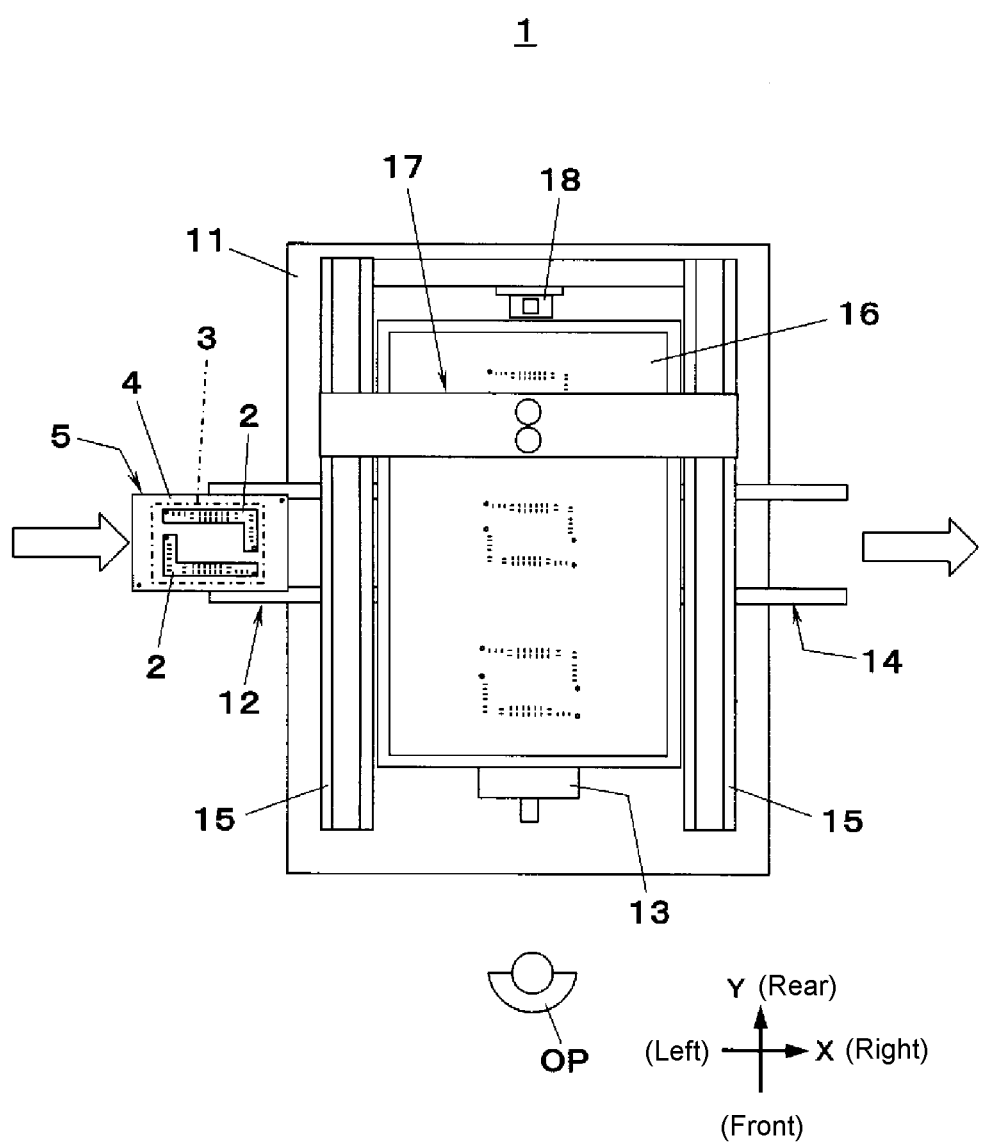
FIG. 1 is a plan view of a screen printing apparatus according to an exemplary embodiment of the present disclosure.
Figure 2:
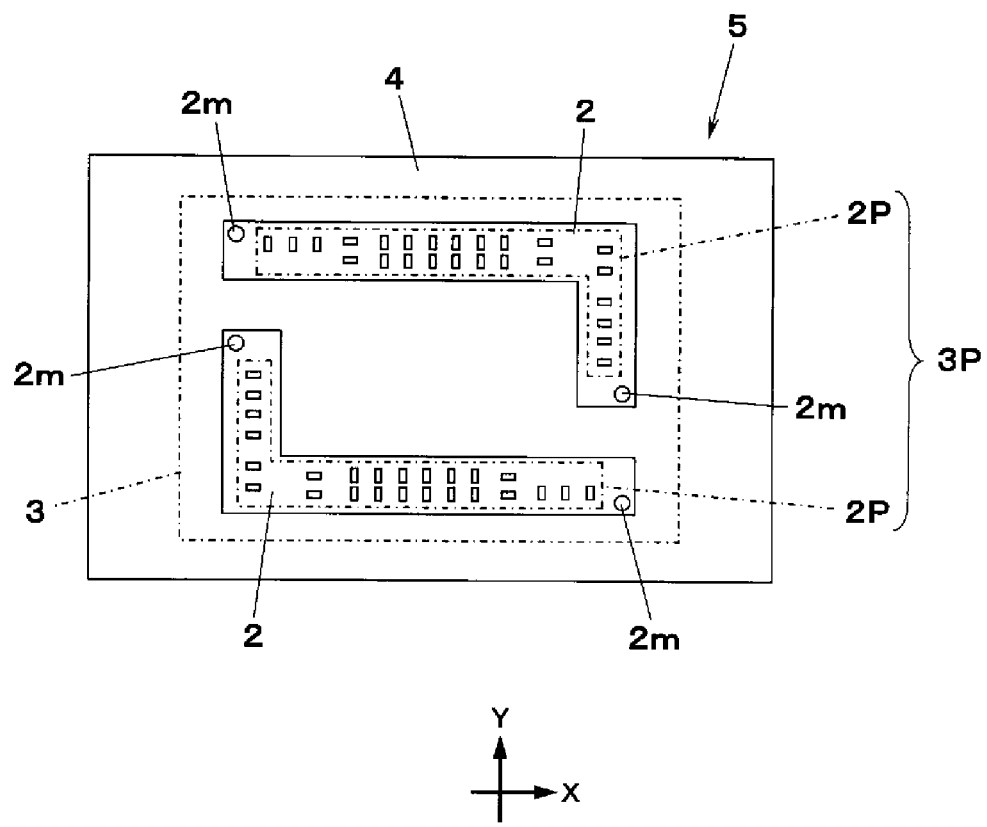
FIG. 2 is a plan view of a work target to be thrown in the screen printing apparatus according to the exemplary embodiment of the present disclosure.

Hereinafter, an exemplary embodiment of the present disclosure will be described with reference to the drawings. FIG. 1 illustrates screen printing apparatus 1 according to the exemplary embodiment of the present disclosure. Screen printing apparatus 1 screen-prints paste such as solder on printed pattern 3P (see FIG. 2) of print target 3 constituted of substrate 2 or a plurality of aligned substrates 2. Herein, the term "plurality of aligned substrates 2" refers to, for example, a plurality of substrates 2 fabricated from a single base substrate and connected to one another at the stage of screen printing, or a plurality of substrates 2 fabricated independently of another and mounted to a carrier at a predetermined position while being aligned with one another. In this exemplary embodiment, as illustrated in FIG. 2, two substrates 2 mounted to carrier 4 while being aligned with each other constitute print target 3, and work target 5 includes two substrates 2 and carrier 4. Moreover, the term "printed pattern 3P of print target 3" refers to a combination of electrode patterns 2P of individual substrates 2 constituting print target 3 (see FIG. 2). Each substrate 2 is a film-shaped substrate.

As illustrated in FIGS. 1, 3A, 3B, and 4, screen printing apparatus 1 includes base 11, and carrying-in unit 12, target holding and moving mechanism 13, and carrying-out unit 14 each mounted on base 11. Screen printing apparatus 1 also includes a pair of beam members 15 provided on both ends in a widthwise direction (defined as an X-axis direction) of base 11 when viewed from operator OP so as to extend in a lengthwise direction (defined as a Y-axis direction) when viewed from operator OP. Mask 16 is placed between beam members 15 in a horizontal attitude. The pair of beam members 15 is provided with squeegee unit 17 that moves above mask 16, and imaging unit 18 that moves below mask 16.

Carrying-in unit 12, target holding and moving mechanism 13, and carrying-out unit 14 are arranged side by side in this order from left when viewed from operator OP. Carrying-in unit 12 includes a pair of conveyors and carries work target 5 (i.e., print target 3) supplied from the outside into screen printing apparatus 1. Target holding and moving mechanism 13 receives and holds work target 5 from carrying-in unit 12, and delivers work target 5 to carrying-out unit 14 after the screen printing for print target 3. Carrying-out unit 14 includes a pair of conveyors and carries work target 5 received from target holding and moving mechanism 13, out of screen printing apparatus 1.

Figure 3A:
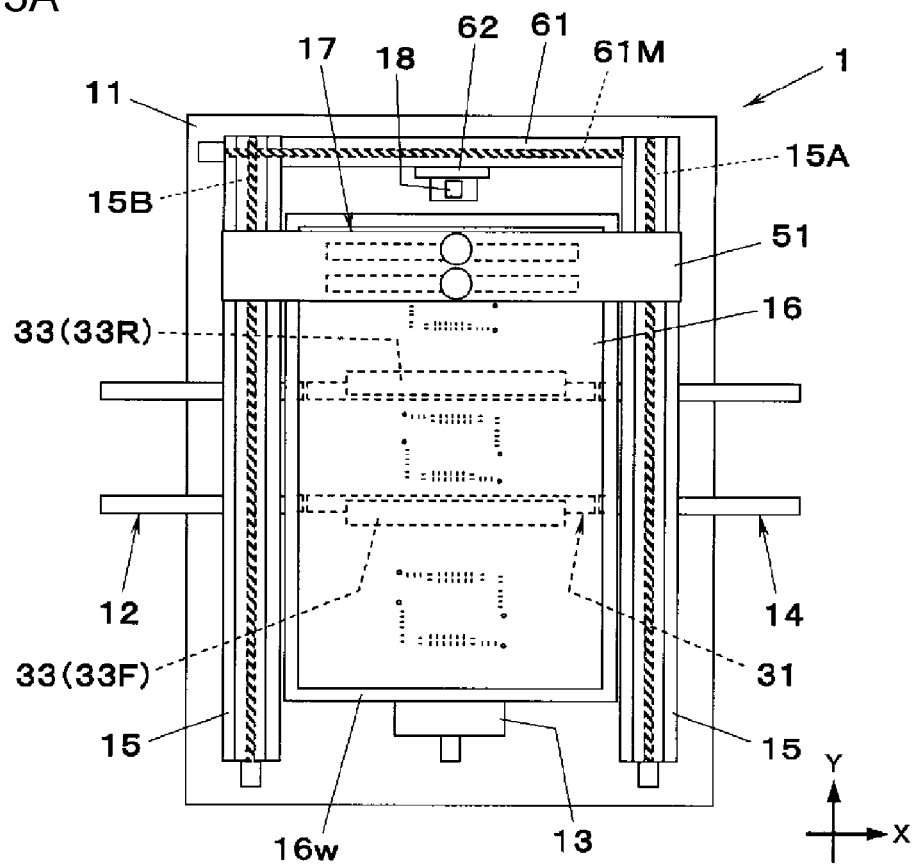
FIG. 3A is a plan view of the screen printing apparatus according to the exemplary embodiment of the present disclosure.
Figure 3B:
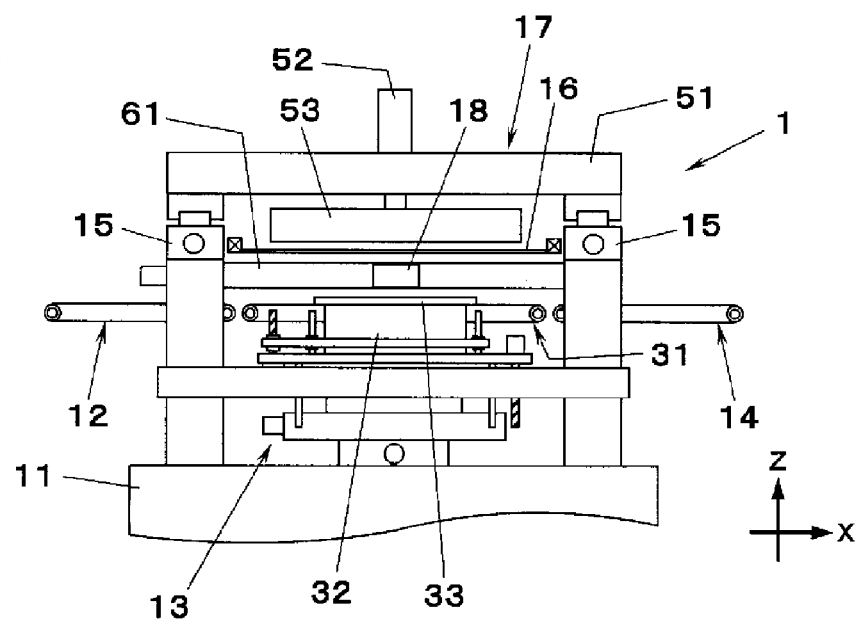
FIG. 3B is a front view of the screen printing apparatus according to the exemplary embodiment of the present disclosure.
Figure 4:
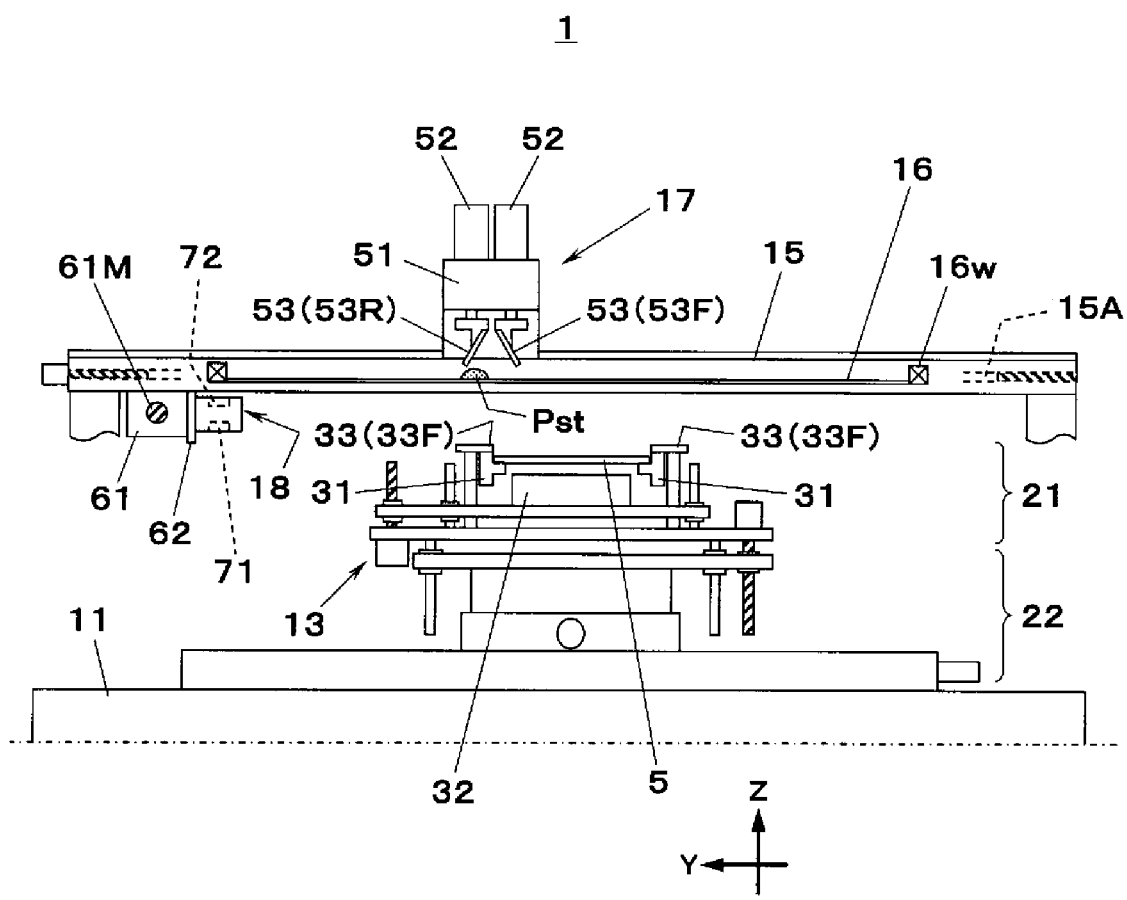
FIG. 4 is a side view of the screen printing apparatus according to the exemplary embodiment of the present disclosure.

As illustrated in FIG. 4, target holding and moving mechanism 13 includes target holder 21 and moving mechanism 22 that moves target holder 21 in a horizontal in-plane direction and a height direction. Target holder 21 includes conveyance unit 31, underlaid bracket member 32, and a pair of clampers 33 (see also FIGS. 3A and 3B).

Conveyance unit 31 includes a pair of conveyors, conveys work target 5, which is received from carrying-in unit 12, in the X-axis direction, and sets work target 5 at a predetermined clamp position below mask 16. Underlaid bracket member 32 supports a lower surface of work target 5 set at the clamp position by conveyance unit 31. The pair of clampers 33 clamps and holds work target 5, which is supported by underlaid bracket member 32, from the Y-axis direction. In this exemplary embodiment, of clampers 33, one located on a side of operator OP (i.e., a front side) is referred to as front clamper 33F, and one located on a side opposite from operator OP (i.e., a rear side) is referred to as rear clamper 33R (see FIGS. 3A and 4).

As illustrated in FIG. 5, mask 16 has a rectangular flat shape expanded and extended in an X-Y plane. An outer periphery of mask 16 is supported by frame member 16w. Mask 16 has three (three types of) opening patterns 40 corresponding to printed pattern 3P. Three opening patterns 40, which are analogous to one another but are different in size from one another, are arranged side by side in the Y-axis direction.

As illustrated in FIG. 5, three opening patterns 40 include center opening pattern 41, front opening pattern 42, and rear opening pattern 43. Center opening pattern 41 is formed on a center portion in the Y-axis direction of mask 16. Front opening pattern 42 is formed on a front side of mask 16, and rear opening pattern 43 is formed on a rear side of mask 16.

Center opening pattern 41 is sized to correspond to printed pattern 3P of print target 3 free from in-plane deformation by expansion and contraction. Front opening pattern 42 is sized to correspond to printed pattern 3P of print target 3 undergoing in-plane deformation by expansion. Rear opening pattern 43 is sized to correspond to printed pattern 3P of print target 3 undergoing in-plane deformation by contraction. When an expansion ratio (H) of a size of center opening pattern 41 is defined as H=1, then an expansion ratio H of front opening pattern 42 is expressed as H>1, and an expansion ratio H of rear opening pattern 43 is expressed as H<1. It is assumed in this exemplary embodiment that the expansion ratio of front opening pattern 42 is expressed as H=1.1 and the expansion ratio of rear opening pattern 43 is expressed as H=0.9. However, the expansion ratios are not limited to the above-described numeric values, and are determined by a material for substrate 2, numeric values to be selected by an operator, and the like.

Moving mechanism 22 selectively locates target holder 21 at any one of a position below center opening pattern 41 (this position is referred to as a first position), a position below front opening pattern 42 (this position is referred to as a second position), and a position below rear opening pattern 43 (this position is referred to as a third position). Carrying-in unit 12 and carrying-out unit 14 form a carrier path for work target 5, which is continuous in an X-direction, with conveyance unit 31 of target holder 21 located at the first position (see FIG. 3A).

As illustrated in FIG. 2, each of two substrates 2 is provided with a pair (i.e., two) of substrate-side marks 2m. Meanwhile, mask 16 is provided with four mask-side marks 16m corresponding to four substrate-side marks 2m of two substrates 2 (i.e., print target 3), at positions near each of opening patterns 40 (see FIG. 5).

Moving mechanism 22 moves target holder 21 to any one of the first position, the second position, and the third position and then raises target holder 21 (i.e., work target 5), thereby bringing an upper surface of print target 3 into contact with a lower surface of mask 16. With the upper surface of print target 3 brought into contact with the lower surface of mask 16, upper surfaces of respective clampers 33, which clamp print target 3, are also brought into contact with the lower surface of mask 16.

Figure 6A:
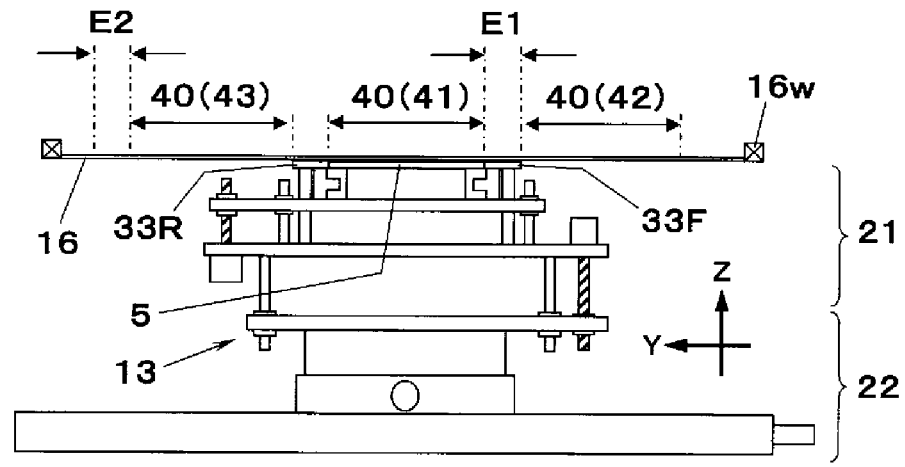
FIG. 6A is a side view of a part of the screen printing apparatus according to the exemplary embodiment of the present disclosure.

FIG. 6A illustrates a state in which moving mechanism 22 raises target holder 21 from the first position to bring the upper surface of print target 3 into contact with the lower surface of mask 16. In this state, center opening pattern 41 is superimposed on printed pattern 3P, front clamper 33F abuts on a front region of center opening pattern 41 in the lower surface of mask 16 (the front region is also a rear region of front opening pattern 42), and rear clamper 33R abuts on a rear region of center opening pattern 41 in the lower surface of mask 16.

Figure 6B:
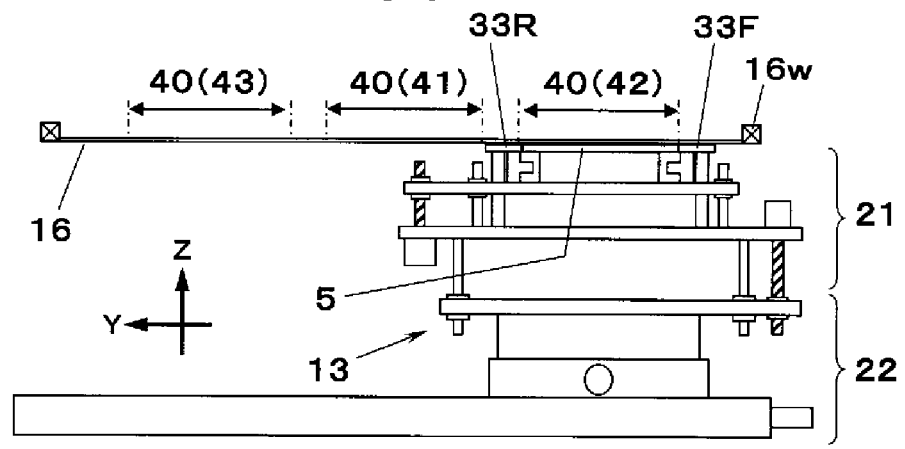
FIG. 6B is a side view of a part of the screen printing apparatus according to the exemplary embodiment of the present disclosure.

FIG. 6B illustrates a state in which moving mechanism 22 raises target holder 21 from the second position to bring the upper surface of print target 3 into contact with the lower surface of mask 16. In this state, front opening pattern 42 is superimposed on printed pattern 3P, front clamper 33F abuts on a front region of front opening pattern 42 in the lower surface of mask 16, and rear clamper 33R abuts on a rear region of front opening pattern 42 in the lower surface of mask 16 (the rear region is also the front region of center opening pattern 41).

Figure 6C:
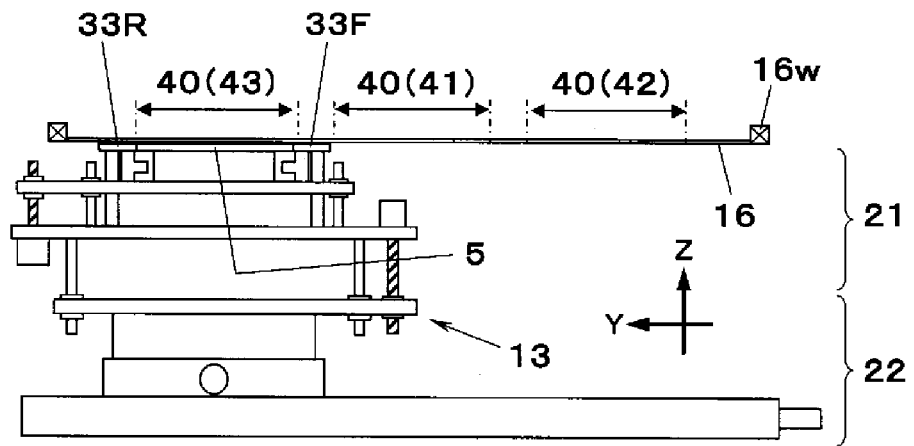
FIG. 6C is a side view of a part of the screen printing apparatus according to the exemplary embodiment of the present disclosure.

FIG. 6C illustrates a state in which moving mechanism 22 raises target holder 21 from the third position to bring the upper surface of print target 3 into contact with the lower surface of mask 16. In this state, rear opening pattern 43 is superimposed on printed pattern 3P, front clamper 33F abuts on a front region of rear opening pattern 43 in the lower surface of mask 16 (the front region is also the rear region of center opening pattern 41), and rear clamper 33R abuts on a rear region of rear opening pattern 43 in the lower surface of mask 16.

In this exemplary embodiment, a region where the upper surface of front clamper 33F is in contact with the lower surface of mask 16 in cases that center opening pattern 41 is superimposed on printed pattern 3P is the same as a region where the upper surface of rear clamper 33R is in contact with the lower surface of mask 16 in cases that front opening pattern 42 is superimposed on printed pattern 3P (see FIGS. 6A and 6B). Moreover, a region where the upper surface of rear clamper 33R is in contact with the lower surface of mask 16 in cases that center opening pattern 41 is superimposed on printed pattern 3P is the same as a region where the upper surface of front clamper 33F is in contact with the lower surface of mask 16 in cases that rear opening pattern 43 is superimposed on printed pattern 3P (see FIGS. 6A and 6C).

As illustrated in FIGS. 5 and 6A, in a region of an upper surface of mask 16, a certain region in front of center opening pattern 41 (i.e., a certain region behind front opening pattern 42) serves as front paste supply region E1, and a certain region behind rear opening pattern 43 serves as rear paste supply region E2. Paste Pst is supplied in advance to both of front paste supply region E1 and rear paste supply region E2.

As illustrated in FIGS. 3A, 3B, and 4, squeegee unit 17 includes squeegee base 51 extending in the X-axis direction and having both ends supported on upper surface sides of beam members 15. Two squeegee lifting cylinders 52 are arranged side by side in the Y-axis direction on a center portion in the X-axis direction of an upper surface side of squeegee base 51, and two squeegees 53 are disposed below two squeegee lifting cylinders 52. Two squeegees 53 are respectively coupled to two squeegee lifting cylinders 52. When two squeegee lifting cylinders 52 are individually activated, two squeegees 53 ascend and descend independently of each other below squeegee base 51, in response to this activation.

Two squeegees 53 extend in the X-axis direction, and two surfaces thereof, which are opposite to each other in the Y-axis direction, individually serve as scraping surfaces of paste Pst. In this exemplary embodiment, of two squeegees 53 arranged side by side in the Y-axis direction, one located on the front side (right side in FIG. 4) is referred to as squeegee 53F and one located on the rear side (left side in FIG. 4) is referred to as rear squeegee 53R. Squeegee base 51 is driven by squeegee base drive mechanism 15A (see FIG. 3A) provided on the pair of beam members 15 to move in the Y-axis direction, so that two squeegees 53 move above mask 16 in the Y-axis direction.

As illustrated in FIGS. 3A, 3B, and 4, both ends of X-axis beam 61 extending in the X-axis direction are attached onto lower surface sides of beam members 15. X-axis beam 61 is provided with moving plate 62 onto which imaging unit 18 is attached. Imaging unit 18 includes lower imaging camera 71 of which an imaging field of view is directed downward, and upper imaging camera 72 of which an imaging field of view is directed upward (see FIG. 4).

X-axis beam 61 is driven by X-axis beam drive mechanism 15B (see FIG. 3A) provided on the pair of beam members 15 to move in the Y-axis direction. Moving plate 62 is driven by moving plate drive mechanism 61M (see FIG. 3A) provided on the X-axis beam 61 to move in the X-axis direction. Therefore, imaging unit 18 is moved below mask 16 in a horizontal direction by the movement of X-axis beam 61 in the Y-axis direction relative to the pair of beam members 15 by X-axis beam drive mechanism 15B and the movement of moving plate 62 in the X-axis direction relative to X-axis beam 61 by moving plate drive mechanism 61M.

Figure 7:
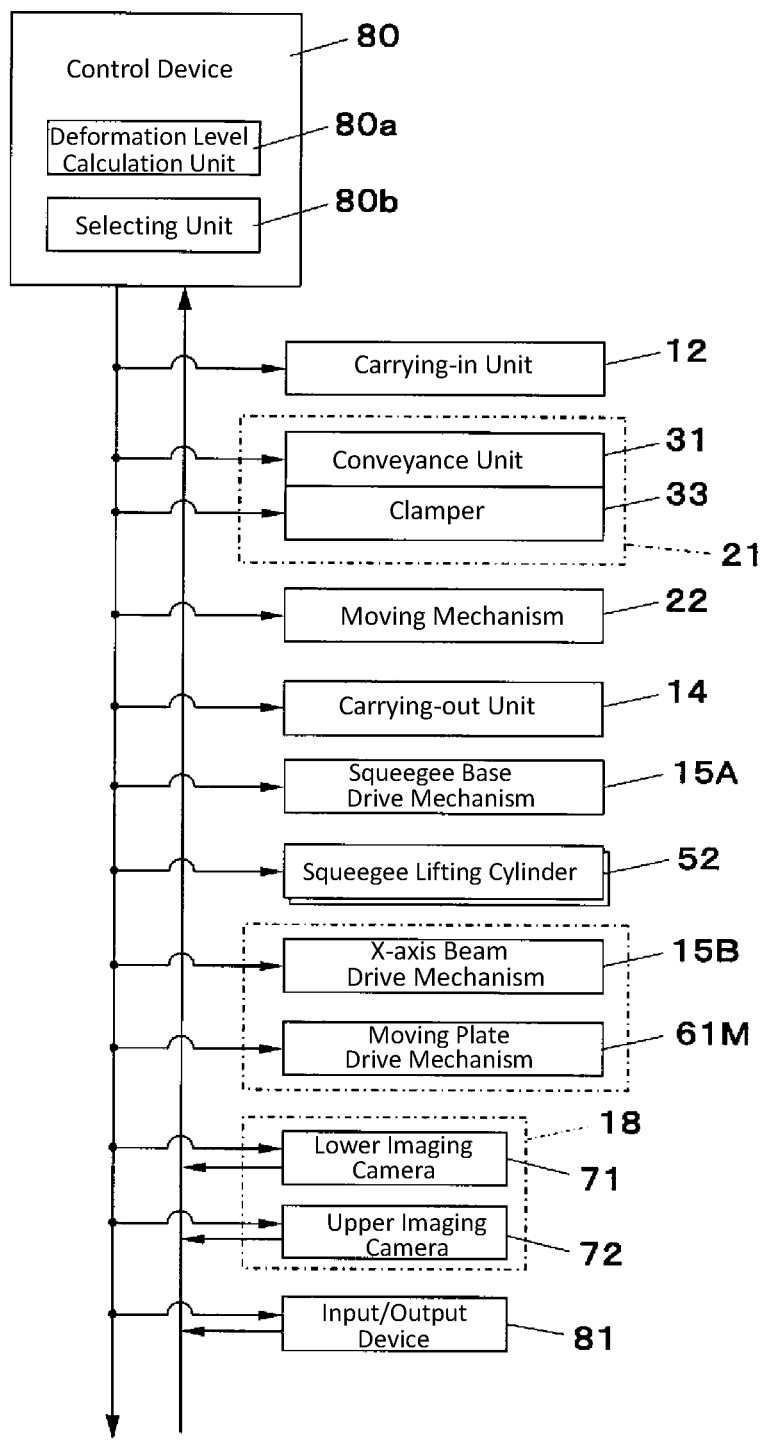
FIG. 7 is a block diagram of a control system of the screen printing apparatus according to the exemplary embodiment of the present disclosure.

As illustrated in FIG. 7, screen printing apparatus 1 includes control device 80 that controls operations including carrying-in of work target 5 by carrying-in unit 12, conveyance of work target 5 by conveyance unit 31 of target holder 21 and holding of work target 5 by clamper 33, movement of target holder 21 by moving mechanism 22, and carrying-out of work target 5 by carrying-out unit 14. Control device 80 also controls operations including movement of squeegee base 51 by squeegee base drive mechanism 15A, lifting of squeegee 53 by squeegee lifting cylinders 52, and movement of imaging unit 18 by X-axis beam drive mechanism 15B and moving plate drive mechanism 61M.

As illustrated in FIG. 7, moreover, control device 80 controls imaging by lower imaging camera 71 and imaging by upper imaging camera 72. Image information obtained as a result of the imaging by lower imaging camera 71 and image information obtained as a result of the imaging by upper imaging camera 72 are input to control device 80. Moreover, input/output device 81 such as a touch panel is connected to control device 80. Operator OP performs required input for screen printing apparatus 1 through input/output device 81 and obtains a variety of information on screen printing apparatus 1 through input/output device 81.

Figure 8A:
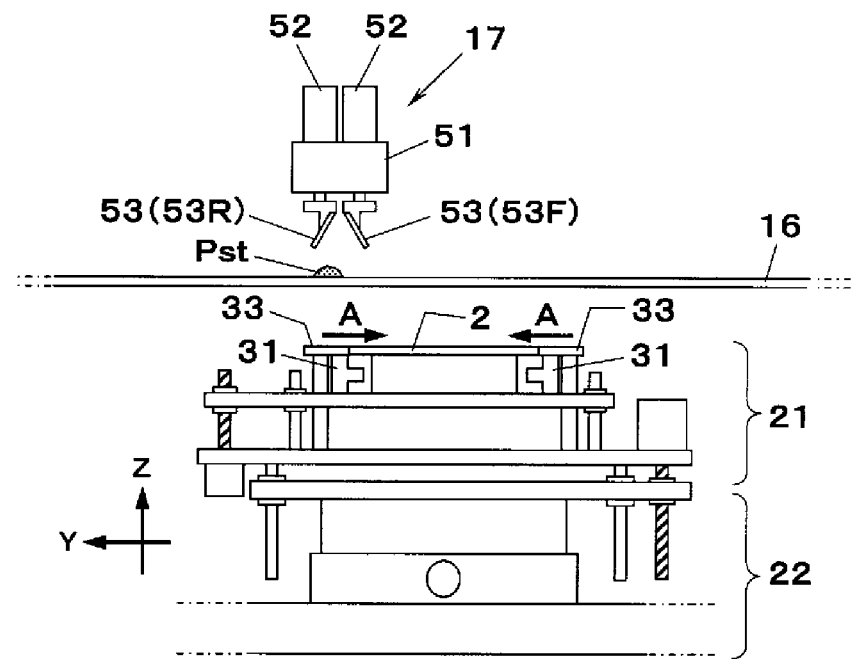
FIG. 8A illustrates operation of the screen printing apparatus according to the exemplary embodiment of the present disclosure.

Next, a description will be given of an execution procedure of screen printing work by screen printing apparatus 1. When work target 5 is supplied to carrying-in unit 12 of screen printing apparatus 1, carrying-in unit 12 carries work target 5 into screen printing apparatus 1, and delivers work target 5 to conveyance unit 31 of target holder 21 located at the first position in advance. Conveyance unit 31 conveys work target 5 to the clamp position below mask 16 (conveyance step). When conveyance unit 31 conveys work target 5 below mask 16, underlaid bracket member 32 ascends to support the lower surface of work target 5 located at the clamp position, and the pair of clampers 33 clamps and holds work target 5 (see arrow A in FIG. 8A).

When the pair of clampers 33 holds work target 5, X-axis beam drive mechanism 15B and moving plate drive mechanism 61M are activated together to move imaging unit 18, and cause lower imaging camera 71 to image substrate-side marks 2m (imaging step). At this time, lower imaging camera 71 images substrate-side marks 2m of a predetermined one of two substrates 2 constituting print target 3. Image information of substrate-side marks 2m imaged by lower imaging camera 71 is sent to control device 80.

After receiving the image information of substrate-side marks 2m from lower imaging camera 71, control device 80 causes deformation level calculation unit 80a (see FIG. 7) to calculate a deformation level of print target 3, based on a result of the imaging of substrate-side marks 2m of predetermined substrate 2 (i.e., a result the imaging by imaging unit 18) which is sent from lower imaging camera 71 (deformation level calculation step). Here, the term "deformation level of print target 3" refers to a level of deviation between a design value and a measured value for a mounting surface of print target 3. The deformation level of print target 3 refers to a level of deformation, which illustrates expansion or contraction of a surface area of print target 3 with respect to the design value. Note that the level of deviation between the design value and the measured value for the mounting surface of print target 3 is determined based on a specific side, a diagonal line, a surface area, and the like. Moreover, the level of deformation also includes a case that print target 3 is warped and the surface area of the captured image is contacted.

In calculating the level of deformation of print target 3, first, control device 80 calculates a distance between substrate-side marks 2m of predetermined substrate 2, based on a result of image recognition for substrate-side marks 2m of predetermined substrate 2, the image recognition result being sent from lower imaging camera 71. Here, the calculated distance is defined as measured value M. Then, a ratio of measured value M thus calculated and design value L of the distance between substrate-side marks 2m is defined as deformation level P (=M/L) of print target 3.

As described above, in this exemplary embodiment, imaging unit 18 is configured to image the substrate-side marks 2m of predetermined substrate 2, and deformation level calculation unit 80a is configured to calculate the level of deformation by expansion and contraction of print target 3, based on the distance between substrate-side marks 2m, which is obtained as a result of the imaging by imaging unit 18. Note that such a calculation method of deformation level P, which is illustrated here, is merely an example, and other calculation methods may be used.

If measured value M for predetermined substrate 2 is equal to design value L at the time when imaging unit 18 images substrate-side marks 2m of predetermined substrate 2, deformation level P becomes equal to 1 (P=1). Deformation level P becomes larger than 1 (P>1) if predetermined substrate 2 expands and measured value M is larger than design value L. Moreover, deformation level P becomes smaller than 1 (P<1) if predetermined substrates 2 contracts and measured value M is smaller design value L.

After deformation level calculation unit 80a calculates deformation level P of print target 3, control device 80 causes selecting unit 80b (see FIG. 7) to select one of three opening patterns 40 (center opening pattern 41, front opening pattern 42, and rear opening pattern 43) of mask 16, based on deformation level P calculated by deformation level calculation unit 80a (selecting step). Selecting unit 80b selects opening pattern 40 by taking, as a criterion, which of three opening patterns 40 of mask 16 brings smallest printing deviation when printed pattern 3P of print target 3 is brought into contact therewith.

Such a selection criterion for allowing selecting unit 80b to select opening pattern 40 can be determined in advance. In this exemplary embodiment, the selection criterion to be determined in advance includes a range of the deformation level, which takes the expansion ratio (H=1.0) of center opening pattern 41 as a reference (first deformation level range set at, for example, $0.95 \leq P \leq 1.05$), a range of the deformation level, which takes the expansion ratio (H=1.1) of front opening pattern 42 as a reference (second deformation level range set at, for example, $1.05 \leq P \leq 1.15$), and a range of the deformation level, which takes the expansion ratio (H=0.9) of rear opening pattern 43 as a reference (third deformation level range set at, for example, $0.85 \leq P \leq 0.95$). Selecting unit 80b is configured to select opening pattern 40 in response to which of the three deformation level ranges a value of deformation level P calculated by deformation level calculation unit 80a falls within.

In the exemplary embodiment, for example, when calculated deformation level P of print target 3 is equal to 1.02 (P=1.02), the value of deformation level P falls within the first deformation level range. Accordingly, selecting unit 80b selects opening pattern 40 of which the expansion ratio H is equal to 1.0 (H=1.0), that is, center opening pattern 41. When calculated deformation level P of print target 3 is equal to 1.12 (P=1.12), the value of deformation level P falls within the second deformation level range. Accordingly, selecting unit 80b selects opening pattern 40 of which the expansion ratio H is equal to 1.1 (H=1.1), that is, front opening pattern 42. When calculated deformation level P of print target 3 is equal to 0.92 (P=0.92), the value of deformation level P falls within the third deformation level range. Accordingly, selecting unit 80b selects opening pattern 40 of which the expansion ratio H is equal to 0.9 (H=0.9), that is, rear opening pattern 43. Note that if calculated deformation level P of print target 3 does not fall within any of the first to third deformation level ranges, selecting unit 80b determines that print target 3 undergoes abnormal deformation, and makes an error determination.

After selecting opening pattern 40 as described above, control device 80 causes moving mechanism 22 to move target holder 21 such that work target 5 is located below selected opening pattern 40. Specifically, control device 80 locates target holder 21 at the first position in cases of selecting center opening pattern 41, locates target holder 21 at the second position in cases of selecting front opening pattern 42, and locates target holder 21 at the third position in cases of selecting rear opening pattern 43.

When target holder 21 is located below selected opening pattern 40, X-axis beam drive mechanism 15B and moving plate drive mechanism 61M are activated together to move imaging unit 18, and cause upper imaging camera 72 to image mask-side marks 16m. Here, mask-side marks 16m imaged by upper imaging camera 72 are a plurality of mask-side marks 16m (FIG. 5), which correspond to selected opening pattern 40. Specifically, upper imaging camera 72 images four mask-side marks 16m, which correspond to center opening pattern 41, when center opening pattern 41 is selected, images four mask-side marks 16m, which correspond to front opening pattern 42, when front opening pattern 42 is selected, and images four mask-side marks 16m, which correspond to rear opening pattern 43, when rear opening pattern 43 is selected. Image information of mask-side marks 16m imaged by upper imaging camera 72 is sent to control device 80.

When upper imaging camera 72 images mask-side marks 16m, X-axis beam drive mechanism 15B and moving plate drive mechanism 61M are activated together to move imaging unit 18, and cause lower imaging camera 71 to image substrate-side marks 2m. At this time, substrate-side marks 2m imaged by lower imaging camera 71 are substrate-side marks 2m of respective substrates 2 constituting print target 3.

When lower imaging camera 71 images substrate-side marks 2m of respective substrates 2 constituting print target 3, then based on a result of the imaging, control device 80 recognizes positions of respective mask-side marks 16m and positions of respective substrate-side marks 2m, and causes moving mechanism 22 to move target holder 21 in the horizontal in-plane direction such that substrate-side marks 2m can coincide with mask-side marks 16m when being seen in plan view. At this time, unless a size of printed pattern 3P corresponds to a size of any of three opening patterns 40, substrate-side marks 2m do not completely coincide with mask-side marks 16m when being seen in plan view. However, it is sufficient substrate-side marks 2m coincides with mask-side marks 16m as a whole (in an average meaning).

Figure 8B:
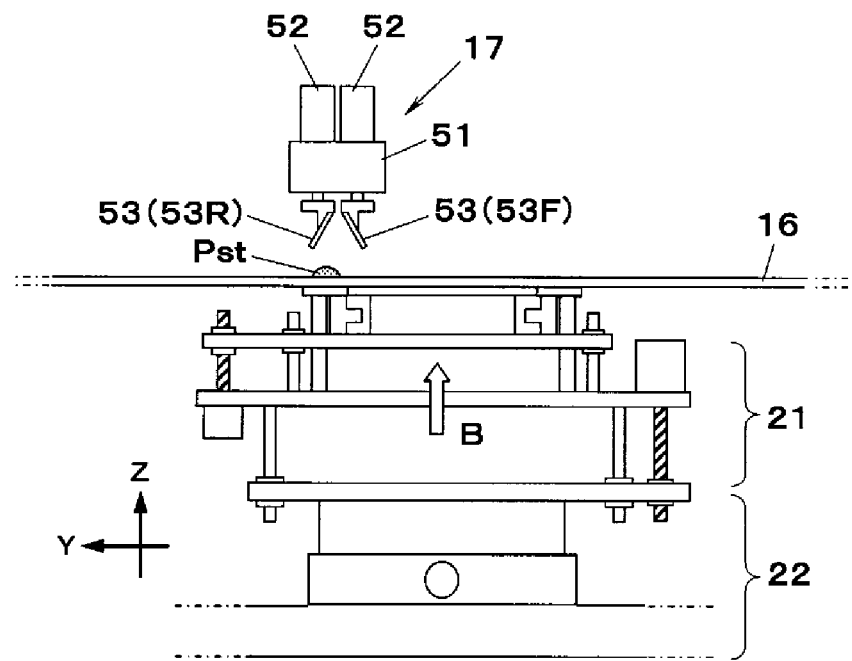
FIG. 8B illustrates operation of the screen printing apparatus according to the exemplary embodiment of the present disclosure.

When substrate-side marks 2m coincide with mask-side marks 16m when being seen in plan view as described above, control device 80 activates moving mechanism 22 to cause moving mechanism 22 to lift target holder 21 (see arrow B in FIG. 8B) and to bring print target 3 into contact with the lower surface of mask 16 (contact step; see FIG. 8B). Selected opening pattern 40 is thus superimposed on printed pattern 3P. In this contact step, moving mechanism 22 functions as a contact mechanism that brings print target 3 into contact with mask 16.

Screen printing apparatus 1 according to this exemplary embodiment includes mask 16 having a plurality of opening patterns 40 which are analogous to one another but different in size from one another. Screen printing apparatus 1 is configured to superimpose one of the plurality of opening patterns 40, based on the calculated level of deformation (deformation level P) of print target 3, on printed pattern 3P. Therefore, even when the level of deformation by expansion and contraction of print target 3 is large, a probability that one of opening patterns 40 is superimposed on printed pattern 3P with accuracy within the allowable range increases in the contact step.

When control device 80 brings print target 3 into contact with mask 16, then control device 80 deposits paste Pst on printed pattern 3P via mask 16 brought into contact with print target 3 (printing step). In this printing step, first, squeegee lifting cylinders 52 are activated to lower one of two squeegees 53, which are provided in squeegee unit 17, with respect to squeegee base 51, and to cause a lower end of lowered squeegee 53 to abut on mask 16. Then, squeegee base drive mechanism 15A moves squeegee base 51 in the Y-axis direction, and slides squeegee 53 on opening pattern 40 (selected opening pattern 40) of mask 16 which is in contact with print target 3. Squeegee 53 thus scrapes paste Pst, which is supplied to front paste supply region E1 or rear paste supply region E2, on mask 16, and fills opening pattern 40 with paste Pst.

Figure 9A:
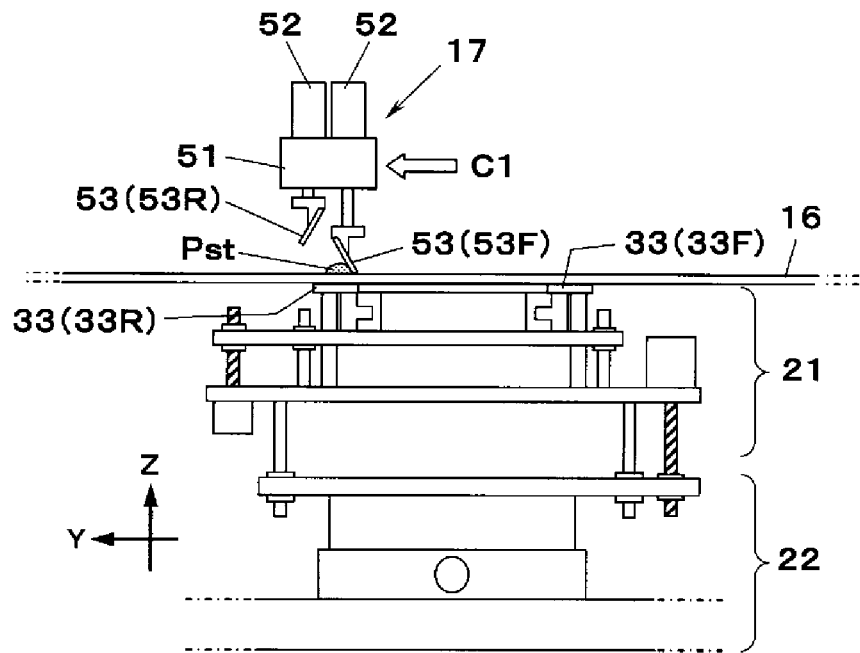
FIG. 9A illustrates operation of the screen printing apparatus according to the exemplary embodiment of the present disclosure.
Figure 9B:
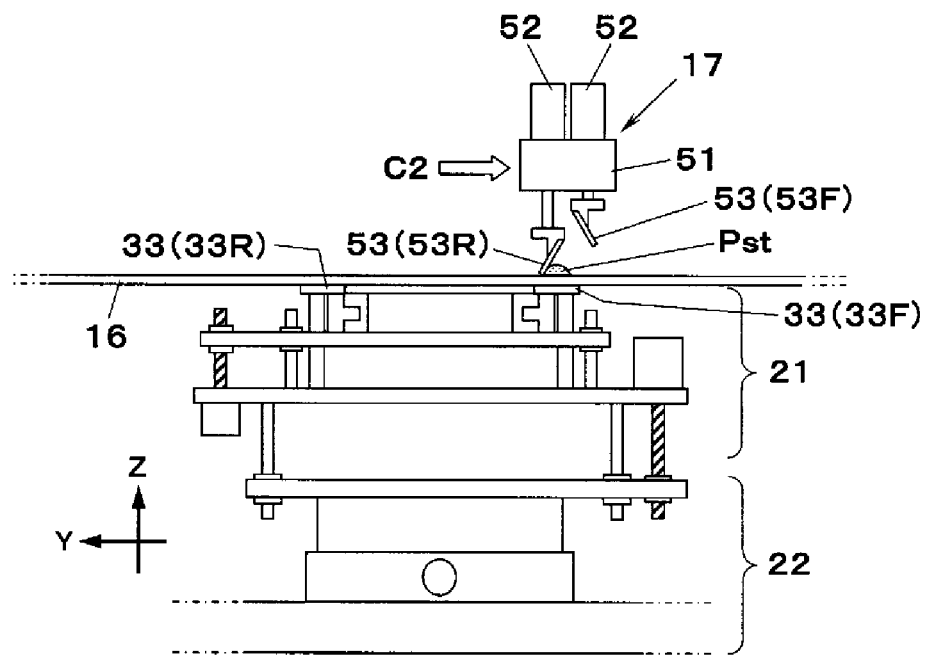
FIG. 9B illustrates operation of the screen printing apparatus according to the exemplary embodiment of the present disclosure.

In filling center opening pattern 41 with paste Pst, first, front squeegee 53F moves rearward from front paste supply region E1, slides on center opening pattern 41 (see arrow C1 in FIG. 9A), and scrapes paste Pst, which is present on front paste supply region E1, to the rear region of center opening pattern 41. Next, rear squeegee 53R moves forward from the rear region of center opening pattern 41, slides on center opening pattern 41 (see arrow C2 in FIG. 9B), and scrapes paste Pst to front paste supply region E1.

In filling front opening pattern 42 with paste Pst, first, rear squeegee 53R moves forward from front paste supply region E1, slides on front opening pattern 42 (see arrow C2 in FIG. 9B), and scrapes paste Pst, which is present on front paste supply region E1, to the front region of front opening pattern 42. Next, front squeegee 53F moves rearward from the front region of front opening pattern 42, slides on front opening pattern 42 (see arrow C1 in FIG. 9A), and scrapes paste Pst to front paste supply region E1.

In filling rear opening pattern 43 with paste Pst, first, front squeegee 53F moves rearward from rear paste supply region E2, slides on rear opening pattern 43 (see arrow C1 in FIG. 9A), and scrapes paste Pst, which is present on rear paste supply region E2, to the rear region of rear opening pattern 43. Next, rear squeegee 53R moves forward from the rear region of rear opening pattern 43, slides on rear opening pattern 43 (see arrow C2 in FIG. 9B), and scrapes paste Pst to rear paste supply region E2.

After opening patterns 40 are filled with paste Pst as described above, paste Pst is deposited on printed pattern 3P, and the printing step is thus ended. In this printing step, squeegee unit 17 functions as a printing unit that deposits paste Pst on printed pattern 3P via mask 16 which is in contact with print target 3.

After the printing step is ended, moving mechanism 22 is activated to lower target holder 21 and to separate (release) work target 5 (i.e., print target 3) from mask 16. Then, the pair of clampers 33 is opened to release the holding of work target 5. Thereafter, conveyance unit 31 and carrying-out unit 14 are activated together to deliver work target 5 to a downstream side.

As described above, screen printing apparatus 1 (screen printing method) according to this exemplary embodiment includes mask 16 having the plurality of opening patterns 40 analogous to one another but different in size from one another. In screen printing apparatus 1 (screen printing method), opening pattern 40 selected from among the plurality of opening patterns 40, based on the calculated level of deformation (deformation level P) of print target 3, is superimposed on printed pattern 3P. Therefore, even when the level of deformation by expansion and contraction of print target 3 is large, there is increased such a probability that one of opening patterns 40 is superimposed on printed pattern 3P with accuracy within the allowable range, and a printing failure is less likely to occur.

As above, the description has been given of the exemplary embodiment of the present disclosure; however, the present disclosure is not limited to those illustrated in the exemplary embodiment. For example, in the exemplary embodiment, the number of substrates 2 attached onto carrier 4 is two; however, this is merely an example, and the number of substrates 2 may be arbitrary while including one. Moreover, in the exemplary embodiment, the number of opening patterns 40 analogous to one another but different in size from one another is three (center opening pattern 41, front opening pattern 42 and rear opening pattern 43); however, this is merely an example, and the number of opening patterns 40 of mask 16 may be arbitrary as long as being two or more.

Moreover, in the exemplary embodiment, opening patterns 40 are a combination of: one sized to correspond to printed pattern 3P of print target 3 free from the in-plane deformation by expansion and contraction (i.e., one of which expansion ratio H is equal to 1 (H=1)); one sized to correspond to printed pattern 3P of print target 3 undergoing the in-plane deformation by expansion (i.e., one of which the expansion ratio His larger than 0 (H>0); and one sized to correspond to printed pattern 3P of print target 3 undergoing the in-plane deformation by contraction (i.e., one of which the expansion ratio H is smaller than 0 (H<0). However, this is merely an example, and it is possible to combine the plurality of opening patterns 40, which have a variety of sizes, with one another.

Moreover, in the exemplary embodiment, in the contact mechanism (or a contact step) that brings print target 3 into contact with mask 16, print target 3 is brought into contact with mask 16 by moving print target 3 with respect to mask 16; however, print target 3 may be brought into contact with mask 16 by moving mask 16 with respect to print target 3. That is, in the exemplary embodiment, moving mechanism 22 is caused to move target holder 21 such that print target 3 can be located below selected opening pattern 40; however, a mask moving mechanism that moves mask 16 in the horizontal direction may be further provided, and mask 16 may be moved so that print target 3 can be located below selected opening pattern 40. Moreover, in cases that operator OP sorts print target 3 in advance in response to the deformation level, the deformation level or selected opening pattern 40 may be input to input/output device 81, and the above-mentioned imaging step may be omitted.

Moreover, in the exemplary embodiment, in case that print target 3 is constituted of a plurality of aligned substrates 2, substrate-side marks 2m of each substrate 2 is imaged and opening patterns 40 is selected. In this case, the ratio of measured value M thus calculated and design value L of the distance between each substrate-side marks 2m is defined as deformation level PO (=M/L) of print target 3. And mean value P of PO of the plurality of aligned substrates 2 is calculated, opening patterns 40 is selected.

Provided are a screen printing apparatus and a screen printing method by which a printing failure is less likely to occur even when the level of deformation by expansion and contraction of a print target is large.

What is claimed is:

1. A screen printing apparatus for printing paste on a printed pattern of a print target constituted of one substrate or a plurality of aligned substrates,
the screen printing apparatus comprising:
a mask having a plurality of opening patterns different in size from one another;
a conveyance unit that conveys the print target below the mask;
an imaging unit that images the one substrate or one of the aligned substrates constituting the print target;
a deformation level calculation unit that calculates a level of deformation by expansion and contraction of the print target, based on a result of the imaging by the imaging unit;
a selecting unit that selects one of the opening patterns, based on the level of deformation by expansion and contraction of the print target, the level being calculated by the deformation level calculation unit; and
a contact mechanism that brings the print target conveyed below the mask by the conveyance unit, into contact with the mask,
wherein
the contact mechanism moves the mask and the print target relatively to superimpose the opening pattern selected by the selecting unit on the printed pattern.

2. The screen printing apparatus according to claim 1, wherein
the imaging unit images a pair of substrate-side marks of the one substrate or one of the aligned substrates, and
the deformation level calculation unit calculates the level of deformation by expansion and contraction of the print target, based on a distance between the substrate-side marks, the distance being obtained from a result of the imaging by the imaging unit.

3. The screen printing apparatus according to claim 1, wherein
the one substrate or each of the aligned substrates is a film-shaped substrate.

4. The screen printing apparatus according to claim 1, wherein
the opening patterns different in size from one another are analogous to one another.

5. A screen printing method for printing paste on a printed pattern of a print target constituted of one substrate or a plurality of aligned substrates,
the screen printing method comprising:
a conveyance step of conveying the print target below a mask having a plurality of opening patterns different in size from one another;
an imaging step of imaging the one substrate or one of the aligned substrates constituting the print target;
a deformation level calculation step of calculating a level of deformation by expansion and contraction of the print target, based on a result of the imaging in the imaging step;
a selecting step of selecting one of the opening patterns, based on the level of deformation by expansion and contraction of the print target, the level being calculated in the deformation level calculation step; and
a contact step of bringing the print target conveyed below the mask in the conveyance step, into contact with the mask,
wherein
the contact step includes moving the mask and the print target relatively to superimpose the opening pattern selected in the selecting step on the printed pattern.

* * * * *